United States Patent [19]
Glaise

[11] Patent Number: 6,014,767
[45] Date of Patent: Jan. 11, 2000

[54] METHOD AND APPARATUS FOR A SIMPLE CALCULATION OF CRC-10

[75] Inventor: Rene Glaise, Nice, France

[73] Assignee: International Business Machines Corporation, Armonk, N.Y.

[21] Appl. No.: 08/834,678

[22] Filed: Apr. 1, 1997

[30]    Foreign Application Priority Data

Sep. 4, 1996   [EP]   European Pat. Off. .............. 96480095

[51] Int. Cl.[7] .................................................. H03M 13/00
[52] U.S. Cl. ........................ 714/776; 714/758; 714/781; 714/807; 708/492
[58] Field of Search ............................. 371/37.01, 37.02, 371/32, 34, 53, 28; 714/752, 776, 748, 750, 807, 745, 781, 758; 708/492

[56]                References Cited

U.S. PATENT DOCUMENTS 5,335,233   8/1994   Nagy ......................................... 371/32
5,539,756   7/1996   Glaise et al. ........................... 371/37.02
5,689,518   11/1997  Galand et al. ......................... 371/37.01
5,694,407   12/1997  Glaise ........................................ 371/53

*Primary Examiner*—Emmanuel L. Moise
*Attorney, Agent, or Firm*—Gerald R. Woods

[57]              ABSTRACT

A process and an apparatus to calculate the FCS (Frame Check Sequence) error checking code of packets payload sent over a fixed size packet networks in a network equipment sending said packets and to check said FCS in the network equipment receiving said packet; this invention applies to calculations of FCS based on CRC (Cyclic Redundancy Checking) codes generated by the polynomial generator of degree 10, $G(X)=X^{10}+X^9+X^5+X^4+X+1$. Particularly, this invention is for use in the ATM layer of ATM nodes processing OA&M and AAL3/4 ATM cells. The solution consists in using the calculation of the FCS based on the CRC code generated by the polynomial generator of degree 9, $X^9+X^4+1$ and simple operations. The calculation and the checking of the FCS is simple and thus the performance are improved authorizing the support of higher speed network lines.

6 Claims, 8 Drawing Sheets

Byte Wise Calculation

Byte Wise Calculation

MULTIPLIER / ADDER

| GF Multiplier Adder | | |
|---|---|---|
| Rest$_{n+1}$ | Rest$_n$ | $B_{n+1}$ |
| $R_8$ = | $R_5 \oplus R_0$ | |
| $R_7$ = | $R_8 \oplus R_4$ | $\oplus B_7$ |
| $R_6$ = | $R_8 \oplus R_7 \oplus R_3$ | $\oplus B_6$ |
| $R_5$ = | $R_7 \oplus R_6 \oplus R_2$ | $\oplus B_5$ |
| $R_4$ = | $R_6 \oplus R_5 \oplus R_1$ | $\oplus B_4$ |
| $R_3$ = | $R_4$ | $\oplus B_3$ |
| $R_2$ = | $R_8 \oplus R_3$ | $\oplus B_2$ |
| $R_1$ = | $R_7 \oplus R_2$ | $\oplus B_1$ |
| $R_0$ = | $R_6 \oplus R_1$ | $\oplus B_0$ |

FIG. 7

| | | | | | | | | | |
|---|---|---|---|---|---|---|---|---|---|
| 0   | . | . | . | . | . | . | . | . | 1 |
| 1   | . | . | . | . | . | . | . | 1 | . |
| 2   | . | . | . | . | . | . | 1 | . | . |
| 3   | . | . | . | . | . | 1 | . | . | . |
| 4   | . | . | . | . | 1 | . | . | . | . |
| 5   | . | . | . | 1 | . | . | . | . | . |
| 6   | . | . | 1 | . | . | . | . | . | . |
| 7   | . | 1 | . | . | . | . | . | . | . |
| 8   | 1 | . | . | . | . | . | . | . | . |
| 9   | . | . | . | . | . | 1 | . | . | 1 |
| 10  | . | . | . | 1 | . | . | . | 1 | . |
| 11  | . | . | 1 | . | . | . | 1 | . | . |
| 12  | . | 1 | . | . | . | 1 | . | . | . |
| 13  | 1 | . | . | . | 1 | . | . | . | . |
| 14  | . | . | . | 1 | 1 | . | . | . | 1 |
| 15  | . | . | 1 | 1 | . | . | . | 1 | . |
| 16  | . | 1 | 1 | . | . | . | 1 | . | . |
| 17  | 1 | 1 | . | . | . | 1 | . | . | . |
| 18  | 1 | . | . | . | . | . | . | . | 1 |
| .   |   |   |   |   |   |   |   |   |   |
| .   |   |   |   |   |   |   |   |   |   |
| .   |   |   |   |   |   |   |   |   |   |
| 493 | 1 | 1 | . | . | . | . | 1 | . | 1 |
| 494 | 1 | . | . | . | 1 | 1 | . | 1 | 1 |
| 495 | . | . | . | 1 | . | . | 1 | 1 | 1 |
| 496 | . | . | 1 | . | . | 1 | 1 | 1 | . |
| 497 | . | 1 | . | . | 1 | 1 | 1 | . | . |
| 498 | 1 | . | . | 1 | 1 | 1 | . | . | . |
| 499 | . | . | 1 | 1 | . | . | . | . | 1 |
| 500 | . | 1 | 1 | . | . | . | . | 1 | . |
| 501 | 1 | 1 | . | . | . | . | 1 | . | . |
| 502 | 1 | . | . | . | 1 | 1 | . | . | 1 |
| 503 | . | . | . | 1 | . | . | . | 1 | 1 |
| 504 | . | . | 1 | . | . | . | 1 | 1 | . |
| 505 | . | 1 | . | . | . | 1 | 1 | . | . |
| 506 | 1 | . | . | . | 1 | 1 | . | . | . |
| 507 | . | . | . | 1 | . | . | . | . | 1 |
| 508 | . | . | 1 | . | . | . | . | 1 | . |
| 509 | . | 1 | . | . | . | . | 1 | . | . |
| 510 | 1 | . | . | . | . | 1 | . | . | . |

FIG. 8

METHOD AND APPARATUS FOR A SIMPLE CALCULATION OF CRC-10

FIELD OF THE INVENTION

This invention relates to Frame Check Sequence (FCS) error code calculation for data integrity checking of packets in high speed packet networks. The invention can be applied to Asynchronous Transfer Mode (ATM) networks in which high speeds require a fast process for data integrity checking.

BACKGROUND OF THE INVENTION

When digital messages are transmitted over telecommunication networks some errors can be expected and to insure data integrity, the serialized data is protected with Error Detection Codes. In modern high speed networks the lines have a low error rate and the security of data only requires a end to end process. The data integrity process is carried out at both the sending and the receiving station; the sending station calculates a code corresponding to the data and the transmitting station checks the integrity of the data and code. ATM uses Frame Check Sequence (FCS) field derived from Cyclic Redundancy Check (CRC) Error Detection codes for error checking. The CRC codes are often used for checking integrity of data because they are easy to implement and they detect a wide range of errors. The access nodes of an ATM network having the responsibility of data integrity, the originating node calculates the redundancy bits constituting the Frame Check Sequence, (FCS) which is appended by the originating system to the bit stream to be checked before sending it over the network. At the end node, a new FCS is computed on the bit stream plus its initial FCS. There is no error in transmission if the computed FCS at the end node yields a constant value depending on the type of CRC used.

CRC codes are generated by a generator polynomial characterizing the type of CRC; the CRC code corresponding to the polynomial representation of a bit stream to be encoded is the remainder of the polynomial division of the polynomial representation of the bit stream by the polynomial generator; CRC calculations are described, for instance, in 'Téléinformatique I' of Henri Nussbaumer, 1987, Presses informatiques romandes CH-1015 Lausanne. The FCS code has been standardized for data integrity checking as described in the ANSI X3.139-1987 document pages 28 and 29 and in the Appendix B. All the CRC codes constitute a finite mathematical multiplying group. If the polynomial generator is of degree d and if it is irreducible, the finite group constitutes a Galois Field having $2^d-1$ elements. The facility of implementing codes based on CRC is due to the simple characteristics of calculations in the finite Galois Fields.

In ATM networks different types of connections between two end points may be established depending on the quality of service required. The ATM Forum organization followed by the ATM network industry and some ATM standards organizations (ITU-T The International Telecommunication Union-Telecommunication and ETSI The European Telecommunication Standardization Institute) have standardized different ATM Adaptation Layers (AALS) to provide generalized interworking across the ATM network. This AAL function is implemented in the ATM end point which connects to the ATM network over the User Network Interface (UNI). As ATM switches usually contain endpoint functions as well as switch functions, AAL function is also implemented in ATM switches. In the case of data, this AAL function takes frames (blocks) of data delivered to the ATM network, breaks them up into cells and adds necessary header information to allow rebuilding of the original block at the receiver. Different AALs correspond to different traffic types. For instance, if AAL1 is used for the service class A, circuit emulation, AAL3/4 provides an end-to-end transport for both connection oriented (class C) and connectionless data (class D).

The ATM cell headers have their own error checking based on FCS calculation. The payload of 384 bits (48 bytes) of some ATM cells uses FCS redundancy bits for error checking; The AAL3/4 cell payload error checking is based on the CRC-10 codes generated by the generator polynomial of degree 10:

$$G(X)=X^{10}+X^9+X^5+X^4+X+1$$

The ATM Operations Administration and Maintenance (OA&M) cell payload also uses FCS redundancy bits for error checking based on CRC-10 codes. The OA&M cells are used for supporting protocols specified as part of the ATM layer designed to dynamically test ATM connections, links, virtual Channels, Virtual Paths and links. These protocols perform the functions of performance monitoring, defect and failure detection, system protection, failure or performance information and fault isolation. These functions must be performed by the management system in an ATM network according to the ATM forum recommendations.

The polynomial representation of a CRC-10 code of a bit stream represented by the polynomial P(X) is the remainder of the polynomial division of P(X) by the generator polynomial G(X) Assuming the CRC-10 code of a data bits stream represented by the polynomial Ps(X) is $Rem_G$ (PA(X) the corresponding FCS code based on CRC-10 is:

$$FCS\ (P(X))=Rem_G(X^{10}P(X)+X^kL(X))$$

k=degree of p(x)

L $(X)=X^{10}+X^9+\ldots+X^2+X+1$

The standard circuitry for computing the FCS of a message is a Linear Feedback Shift Register (LFSR) which carries out a bit by bit multiplication in the Galois Field. Each bit of the message is pushed in the LFSR, Most Significant Bit (MSB) first. The division is performed by the feedbacks. At the end of the process, the FCS (remainder of the division) is within the shift register. This method and type of circuitry is described, for instance in 'Error Checking Codes' by Peterson and Weldon, the MIT Press, 2nd edition, 1972. Although simple the method suffers drawbacks since only one bit is processed at each shift as many shifts as the number of bits is the message is needed in the LFSR. As the 10 bits CRC is used, a 10-bit register is needed. Therefore computing the CRC takes as many clock pulses as there are bits in the message.

A faster CRC calculation is provided in the patent application published under the reference EP 0614 294 entitled 'Method for generating a frame check sequence' disclosing a one (or more) byte(s) based FCS calculation, this method being more efficient than a bit based FCS calculation as with the LFSRs. This patent application takes advantage of the properties of the operations in the Galois Fields. One property of the Galois Field is to have a root α, an irreducible polynomial element of the Galois Field, characterized in that each element of the Galois Field is represented by $\alpha^d$, d being one integer greater or equal to zero and smaller than the number of elements of the Galois Field. According to the preferred embodiment of the cited patent application, the calculation of FCS of a byte stream can be performed byte by byte, each new byte read being XORed with the result of the multiplication of the previous FCS value by the $\alpha^8$ element of the Galois Field. The multiplier is the implementation of the $\alpha^8$ multiplication in the Galois Field, this means modulo the polynomial generator G(X). The mathematical formula illustrating the method is expressed in the Galois Field as follows:

$$FCS(N+1)=FCS(N) \otimes \alpha^8 + B(N+1) \quad \text{(expression 1)}$$

Where FCS(N) is the FCS of the message consisting of the N previous bytes, B(N+1) the polynomial representation of the next byte (new byte) of the message.

- $\otimes$ is the sign of the polynomial multiplication in the Galois Field. It is a two step operation comprising a first step to multiply the two polynomials and a second step to take the remainder of the result in the division by G.
- $\alpha$ at is an irreducible polynomial, root of the Galois Field generated by G.
- $\alpha^8$ is the 9th element of the Galois Field (simple element having only one coefficient equal to 1 in its polynomial representation).

This per byte calculation of the FCS is implemented using a Multiplier adder implemented in adapter cards of the ATM access nodes. The same method can be used also for this calculation while handling any number of bits at a time consequently improving the processing time. However, with the method of the prior art and the current technologies, it is very difficult to perform the FCS calculations for data integrity checking of cell payload while sustaining media speed particularly over OC3 links (155 Mbps which allows 2.8 µs to process the cell).

It is the object of the invention to simplify and reduce process time of cell payload FCS calculations such as those performed in an ATM access node sending OA&M or AAL3/4 types of cells on the ATM network. The same performance improvement should apply to the process of checking the OA&M or AAL3/4 cell payload FCS in the access node at cell reception.

SUMMARY OF THE INVENTION

The invention discloses a method for calculating the FCS (Frame Check Sequence) based on CRC (Cyclic Redundancy Check) code generated by the polynomial generator of degree 10, $G10(X)=X^{10}+X^9+X^5+X^4+X+1$, of a packet payload in a packet network, said method comprising the steps of:

- calculating (520) CRC code generated by the polynomial generator of degree 9, $G9(X)=X^9+X^4+1$, of the packet payload and storing the resulting 9-bit stream FCS in 9-bit storage means;
- calculating (510) the parity of said payload; setting (580) the most significant bot of the 10-bit storage means to zero;
- if the payload parity is odd (590), adding (597) the 9-bit stream FCS to a bit stream representation of the generator polynomial of degree 9, G9(X); and
  storing the 10-bit stream resulting from the addition of the previous step in the 10-bit storage means, this stored 10-bit stream representing the payload FCS that was to be calculated;
- if the payload parity is even, storing (595) the 9-bit stream FCS in the least significant bits of the 10-bit storage means, the 10-bit stream of the 10-bit storage means representing the payload FCS that was to be calculated.

The method of the invention turns a CRC calculation based on the polynomial generator of degree 10, $G10(X)=X^{10}+X^9+X^5+X^4+X+1$ into a much simpler CRC calculation based on the simpler polynomial generator of degree 9, $G9(X)=X9+X^4+1$.

The step of the method implementing the calculation of the CRC code generated by the polynomial generator of degree 9, $G9(X)=X^9+X^4+1$ of the packet payload can be performed by any known method of CRC calculation; more particularly, this CRC calculation can use the calculation in the Galois Field disclosed in the prior art which adds in the simplification and as reducing processing brings more performance. Combining the method of the present invention with this known CRC calculation brings a simplification leading to higher performance; consequently, when implemented in ATM nodes adapters, the method of the invention allows support of higher speed lines.

The invention discloses also an apparatus comprising means for implementing the steps of the method disclosed in the present invention.

BRIEF DESCRIPTION OF THE DRAWINGS

FIG. 7 illustrates all the operations caracterizing the Galois Field multiplier Adder of FIG. 2 based on the Galois Field generated by the generator polynomial of degree 9.

FIG. 8 is the representation of the first and the last elements of the Galois Field generated by the generator polynomial of degree 9, $X^9+X^4+1$.

DETAILED DESCRIPTION OF THE PREFERRED EMBODIMENT

In the preferred embodiment, the calculation and checking of FCS is done on the OA&M or AAL3/4 ATM cells.

Figure 1:
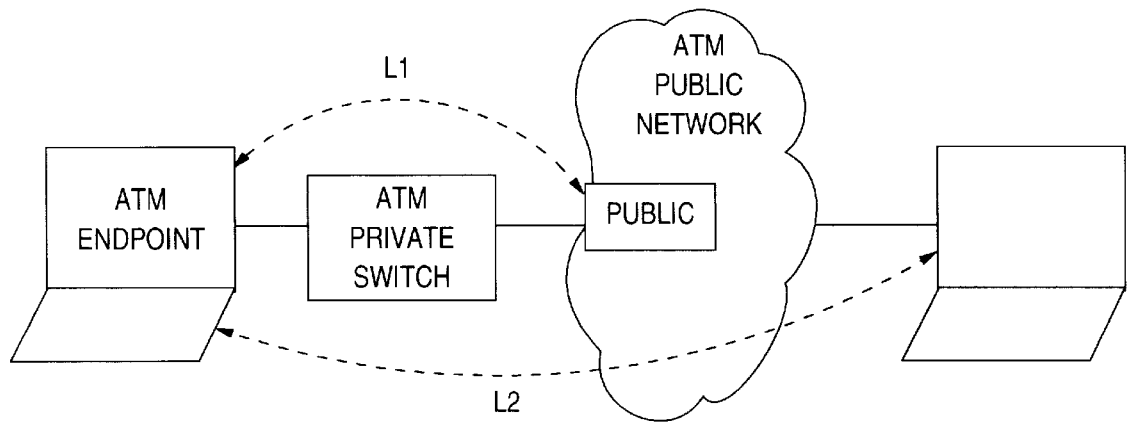
FIG. 1 depicts the OA&M cells flow in an ATM network

FIG. 1 illustrates the ATM loopback tests based on the OA&M cell protocols at Virtual Path level or Virtual Channel level on an OA&M segment (single link) flow L1 or on a OAM end-to-end flow L2. The L1 flow is established between an ATM end point providing the ATM interface and the access point of the public network, noted as 'public' in FIG. 1. This segment to be tested may cross an ATM private network comprising one or more ATM private switches. The L2 flow establish a test loop between two ATM end points located from one side to the other side of the ATM public network.

The generator polynomial provided by the standards organizations for CRC-10 calculation is non irreducible. It can be factorized as follows:

$$G(X)=X^{10}+X^9+X^5+X^4+X+1$$

$$G(X)=(X^9+X^4+1)(X+1)$$

The two polynomial factors are quite simple. In terms of implementation of Galois Field calculations, the complexity of the hardware or software is a direct function of the number of terms in the polynomial generator of the Galois Field; with the hardware implementation of the fast CRC calculation of the cited prior art, the number of terms is directly related to the number of n-way XOR gates. As a matter of fact, the degree nine polynomial factor has three terms as the degree 10 polynomial generator has 6 terms: their binary representation have respectively 3 and 6 bits set to 1. A significant simplification may be anticipated if one may use the degree 9 instead of the original degree 10 polynomial in the CRC-10 codes computation. It is noted that no simpler polynomial could possibly exist since all the irreducible polynomials have an odd number of ones equal or larger than 3.

Calculations performed in algebra of polynomials are similar those done with ordinary numbers in that if a number is divisible by 6 it is also divisible by 2 and 3. Similarly, with binary polynomials, if one polynomial is divisible by $X^{10}+X^9+X^5+X^4+X+1$, it is also divisible by $X^9+X^4+1$ and $X+1$. This means that elements of the Galois Field generated by the irreducible polynomial generator of degree 9 can be used to calculate the elements of the Galois Field generated by the polynomial generator of degree 10, i.e., the CRC-10. The solution will consist first in performing calculations made in the Galois Field generated by the irreducible polynomial generator of degree 9 than to use this first calculation to calculate FCS based on CRC-10. FIG. 8 illustrates the first and the last elements of the Galois field generated by the irreducible polynomial generator of degree 9 (of $2^9-1=511$ elements.

The ATM cells have a payload of 48 bytes, 384 bits. The first 374 first bits constitue the information field and the remaining 10 bits are used for storing the FCS of the payload based on CRC-10 codes. The method for checking the payload (48 bytes or 384 bits including the 10 bits of FCS) of a received OA&M cell consists in dividing the polynomial representation of the payload 384 bit stream by the irreducible polynomial of degree 9, $X^9+X^4+1$, and dividing also the same payload 384 bit stream by the polynomial $X+1$. If both remainders in the divisions just described are zero then, the CRC-10 checking is correct. If not, the cell payload is in error and the cell is discarded; a 'higher level protocol' than the adaptation layer handles the error recovery. However, dividing the polynomial representation of the cell payload bit stream by the polynomial $X+1$ is checking the parity of the cell payload. This is a known calculation already implemented, for the computation of the BIP-16 (Bit Interleave Parity) of the 'performance monitoring' function of OA&M cells.

Figure 5:
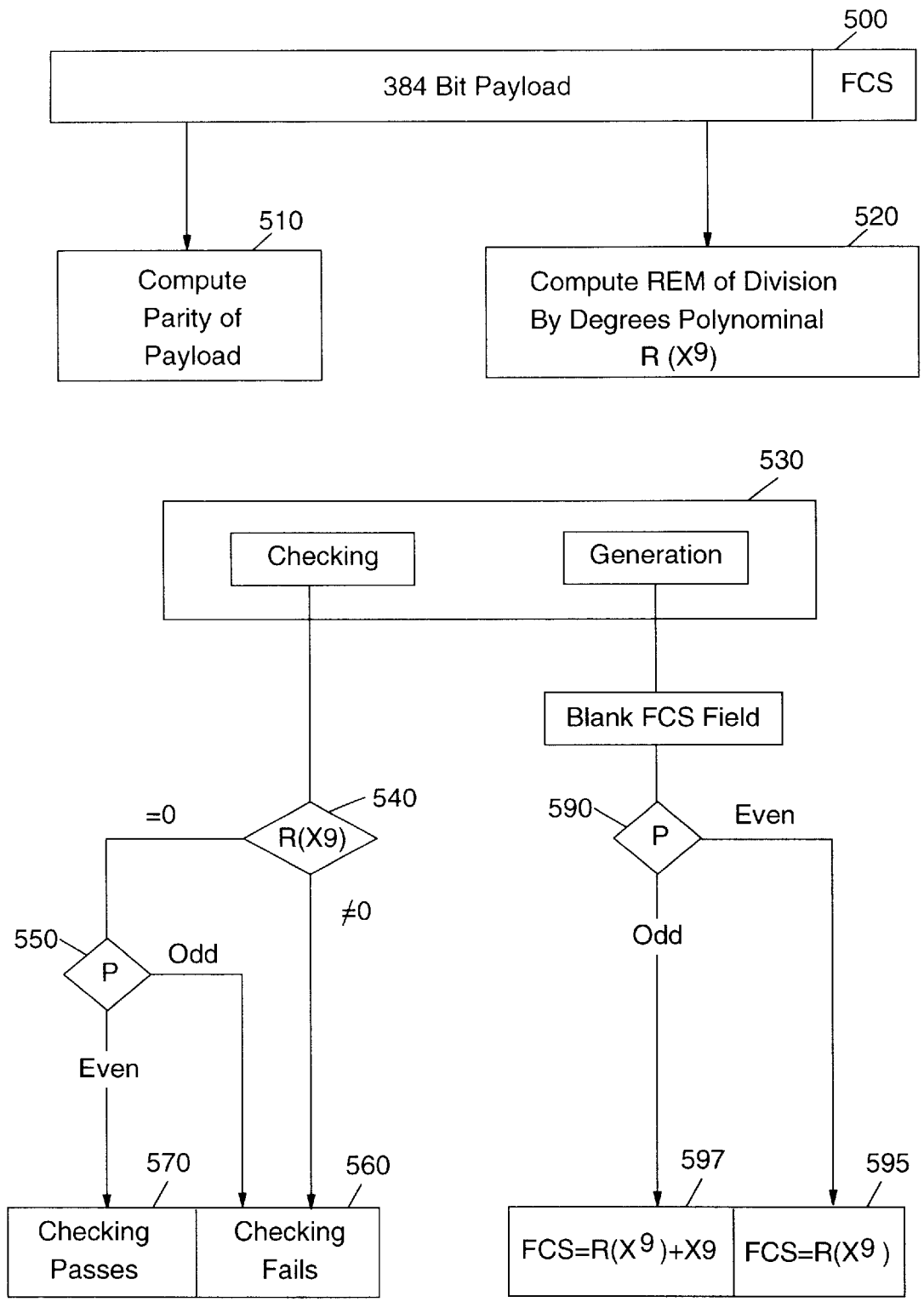
FIG. 5 is the chart flow of the generation of FCS and the checking of FCS.

The checking of cell is illustrated in FIG. 5. The cell payload 384 bit stream to be checked is read (500); it is noted that this payload includes the 10 bits FCS which has been calculated when the cell was sent. The parity of the payload is then calculated and stored (510). In parallel, when the cell is received, the polynomial division of the polynomial representation of the payload bit stream by the polynomial of degree 9, $X^9+X^4+1$, is performed and the remainder, $R(X^9)$, is stored (520). The polynomial remainder, $R(X^9)$, is of degree lesser than 9. When the cell is received the checking is started (530) at reception of the cell. The polynomial remainder of the division of the payload bit stream by the polynomial generator of degree 9, $X^9+X^4+1$ is tested (540), if it is not zero (all coefficients of the remainder polynomial are zero or all the bits are zero), the checking has failed (560). If not, the parity of the payload bit stream is tested (550). If the parity is odd, checking has failed. If the parity is even, checking passes.

The calculation of the cell FCS is illustrated also in FIG. 5. For starting FCS generation (530) before one cell is sent over the network, the parity of the 374 bits cell payload is calculated and stored (510). In parallel, the polynomial division of the polynomial representation of the payload bit stream by the polynomial of degree 9, $X^9+X^4+1$, is performed and the remainder, $R(X^9)$, is stored (520). The 10 bits cell FCS field is filled with zeros (580). The parity of the payload is then tested (590); If odd, the polynomial representation of the FCS field in the cell payload is calculated (597) as the result of the addition of the remainder, $R(X^9)$, of the division of the payload bit stream polynomial by the polynomial generator of degree 9, $X^9+X^4+1$ with $X^9$:

$$FCS=R(X^9)+X^9$$

If the parity of the payload tested (590) is even, the FCS field in the cell payload is then (595) the remainder, $R(X^9)$, of the division of the payload bit stream polynomial by the polynomial generator of degree 9, $X^9+X^4+1$:

$$FCS=R(X^9)$$

The polynomial representation of the FCS code of the payload is of degree 9 and the corresponding FCS field in the cell payload comprising 10 bits.

Figure 2:
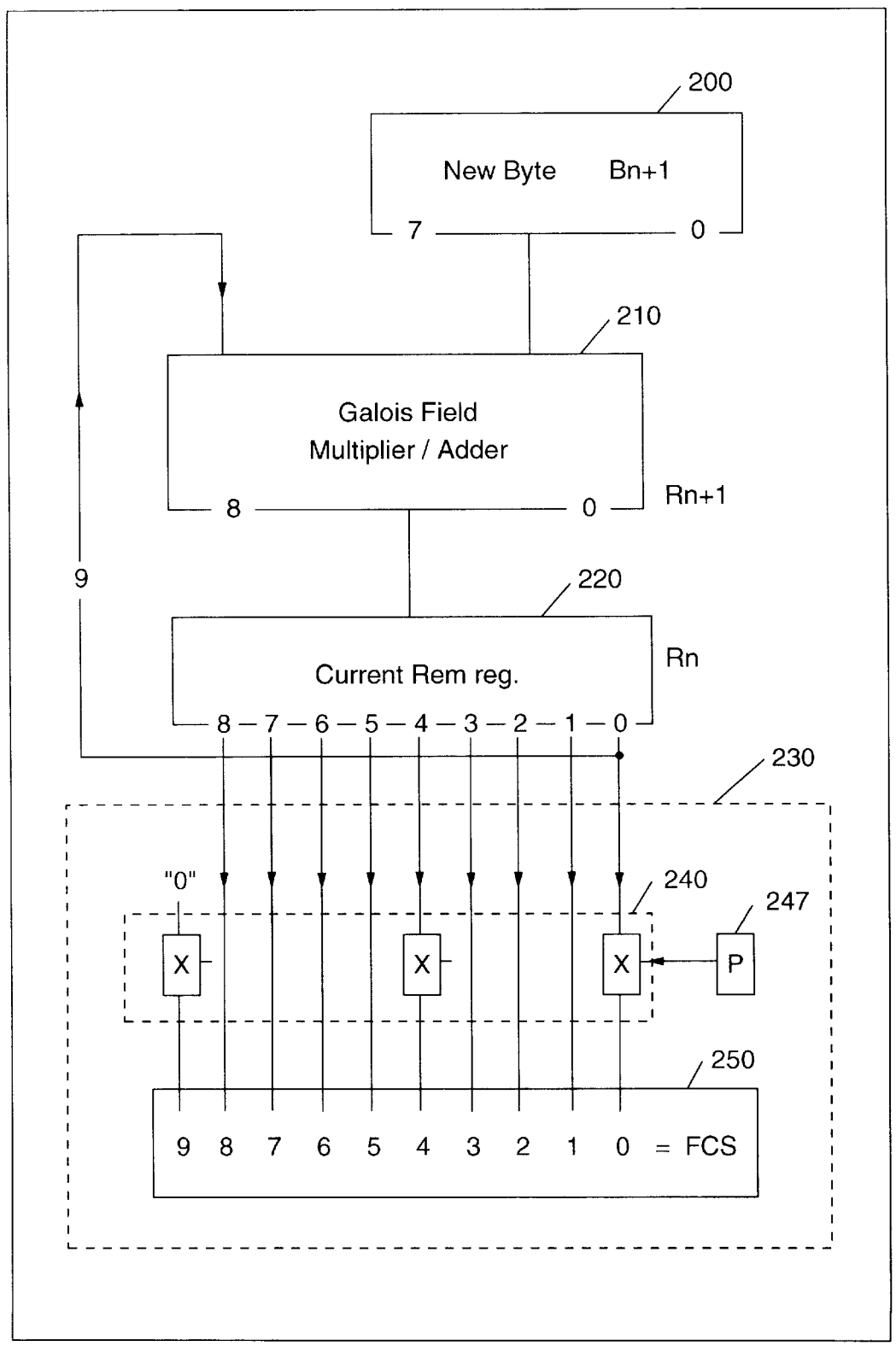
FIG. 2 depicts the logical diagram of a Byte wise calculation of FCS.

FIG. 2 illustrates the logical blocks of the apparatus implementing the method of the invention to calculate the FCS of the payload. In this preferred embodiment, it is a byte wise process. The payload is read byte by byte in a register (200). Each new byte Bn+1 of the cell payload is entered in the Galois Field Multiplier/Adder (210). This Multiplier/Adder computes byte by byte the FCS of the byte stream based on the Galois-Field elements generated by the polynomial generator of degree 9, $X^9+X^4+1$ according to the process of the cited prior art. The Multiplier/Adder first multiplies the 9 bits FCS (Rn) calculated on the previous payload bytes, up to byte n, by $\alpha^8$, the 9nth element of the Galois field, and secondly, takes the remainder of the division of the resulting bit stream by the polynomial generator of degree 9. The resulting bit stream is then added to the Bn+1 8 bit stream corresponding to the new payload byte read, the result of the addition being stored in the current remainder register (220). The result stored is the FCS of the payload calculated up to byte n+1, Rn+1. This first blocks (200, 210, 220) are implementing the first step of the method (520).

Figure 3:
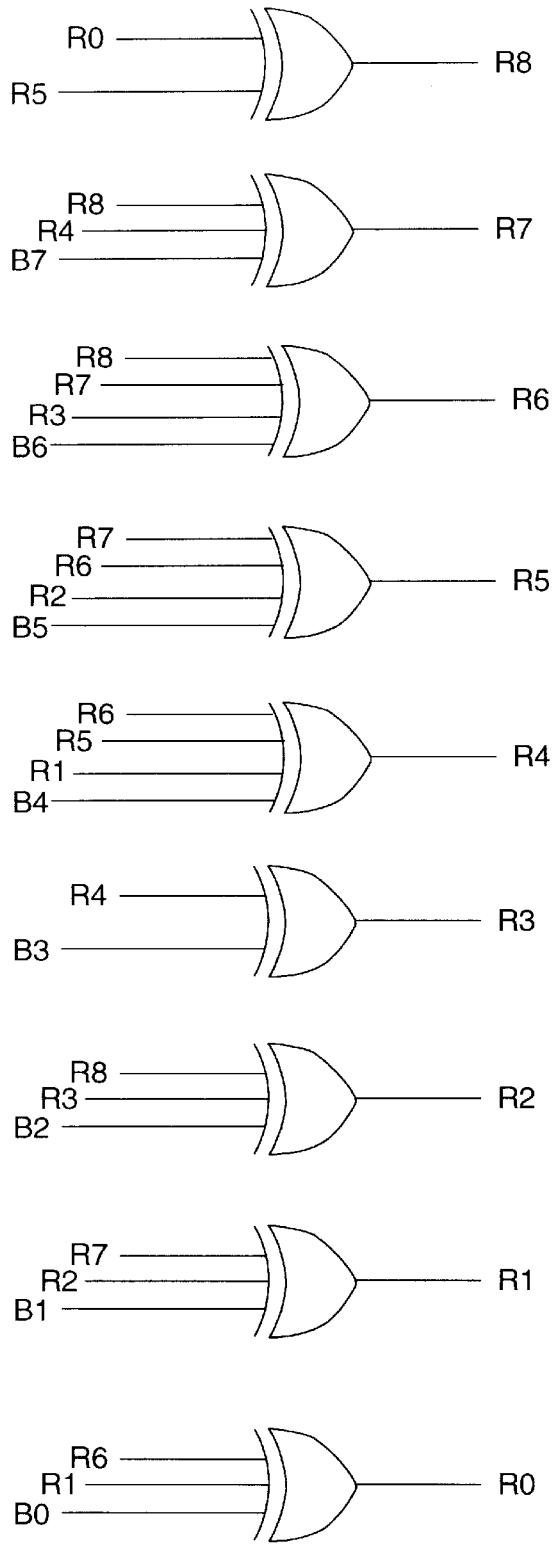
FIG. 3 illustrates the Galois Field multiplier/Adder of FIG. 2.
Figure 6:
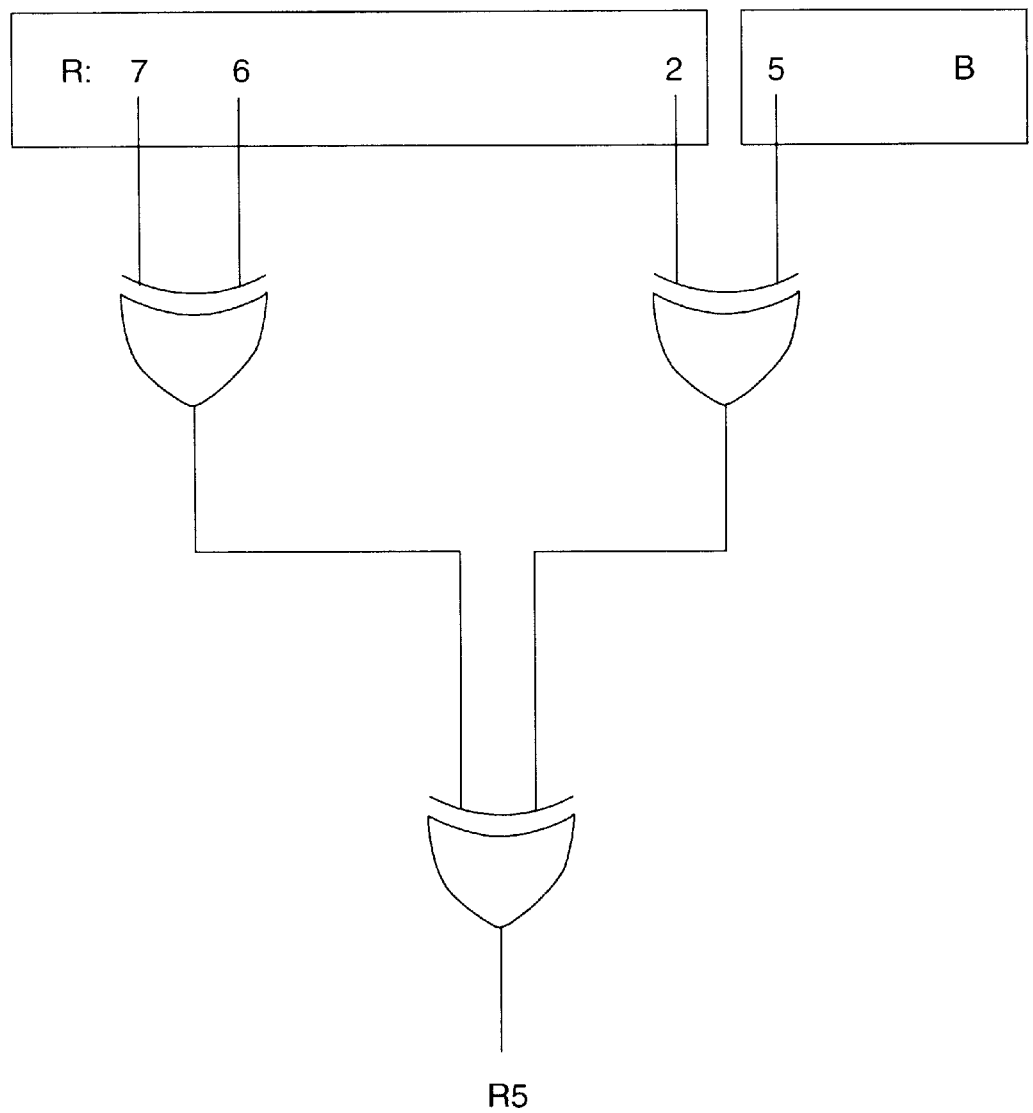
FIG. 6 illustrates the calculation of bit 5 of FIG. 3 which is set in the current Remainder Register.

As disclosed in the European application EP0614294 of the prior art, a hardware implementation of the Multiplier/Adder (210) of FIG. 2 is shown in FIG. 3. There are 9 XOR gates as the polynomial generator is of degree 9. Because the polynomial has three non zero terms the widest XOR gate is a 4-way XOR. The first entries of XOR gates are the R0, R1, . . . R8 binary values corresponding to the 9 bits of the Rn bit stream representing the FCS of the payload calculated up to byte n (Rn). The other entries to the XOR gates are the B0, B1, . . . B7 binary values corresponding to the 8 bits of the new byte Bn+1 of the payload. The XOR gate entries are combined in accordance with the calculation in the Galois Field generated by the polynomial generator of degree 9. FIG. 6 is an example of an actual hardware implementation of the 4-way XOR corresponding to the calculation of bit R5 in Rn+1 bit stream using 2-way XOR gates. The XOR gate entry combinations perform the multiplication and addition in the Galois Field generated by the polynomial generator of degree 9. The table of FIG. 7 provides the list of operations of the GF Multiplier/Adder 210 for each bit of the 9 bit FCS stream.

Coming back to FIG. 2, in the second hardware block (230) of the implementation is a 10 bits adder (240) having as inputs: the 9 bits FCS stream just computed (220), the parity of the payload (247), the bit stream corresponding to the generator polynomial of degree 9 and the 0 value for the most left bit added. The resulting 10 bits stream of the addition is stored in the FCS register (250). The hardware block (230) is for implementing the steps of the method (580, 590, 597, 595) described in FIG. 5.

Figure 4:
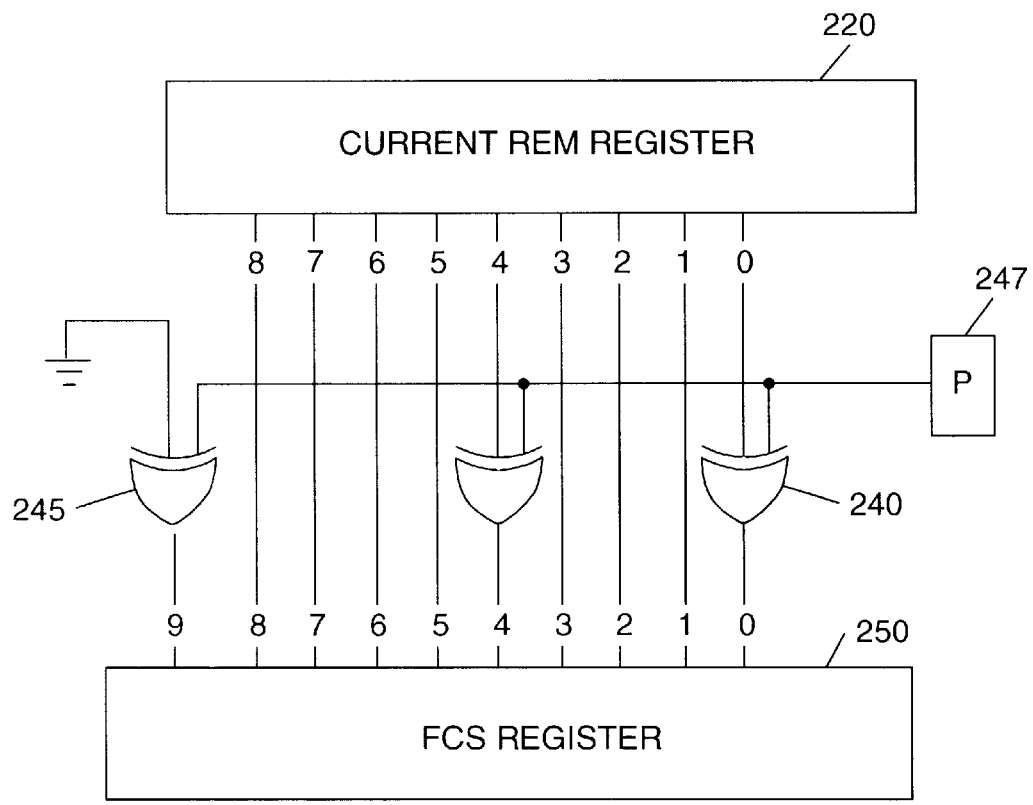
FIG. 4 illustrates the component of FIG. 2 allowing calculation of FCS from the current Remainder Register.

FIG. 4 shows an implementaion of the polynomial of degree 9 addition of FIG. 2. To the content of the current rem register (220) are applied three 2 way XOR gates (240) at positions corresponding to the ones of the polynomial generator of degree 9. The first entry of the most left 2 way XOR gate (245) is always zero, the output thus reflecting the second input value: the parity (247) of the cell payload. The parity applied to all the XOR gates of the addition changes the corresponding bit value only if the parity is ODD. The resulting bits stream is stored in the 10 bit FCS register (250).

What is claimed is:

1. A method for generating a packet, the integrity of which may be checked upon receipt at a destination node to which the packet is sent through a packet network, said method comprising the steps of:

calculating a FCS (Frame Check Sequence) value based on CRC (Cylical Redundancy Check) code generated by the polynomial generator of degree 10, $G10(X)=X^{10}+X^9+X^5+X^4+X+1$, of a packet payload by calculating (520) CRC code generated by the polynomial generator of degree 9, $G9(d)=X^9+X^4+1$, of the packet payload and storing the resulting 9-bit stream FCS in 9-bit storage means, calculating (510) the parity of said payload, setting (580) the most significant bit of a 10-bit storage to zero, if the payload parity is odd (590), adding (597) the 9-bit stream FCS to a bit stream representation of the generator polynomial of degree 9, G9(X) and storing the 10-bit stream resulting from the addition of the previous step in the 10-bit storage means, this stored 10-bit stream representing the payload FCS, if the payload parity is even, storing (595) the 9-bit stream FCS in the least significant bits of the 10-bit storage means, the 10-bit stream of the 10-bit storage means representing the payload FCS;

retrieving the packet for which the foregoing calculations were performed and the 10-bit stream representing the payload FCS; and generating a packet suitable for transmission by adding the retrieved payload FCS to the payload of the retrieving packet.

2. A method for checking the integrity of a packet in a packet network, having an extended payload field comprising an n-bits data bytes payload extended with a 10-bit stream FCS (Frame Check Sequence) calculated on the payload, said 10-bit FCS being based on CRC (Cyclic Redundancy Check) code generated by the polynomial generator of degree 10, $G^{10}(X)=X^{10}+X^9+X^5+X^4+X+1$, said method comprising the steps of:

calculating (520) the CRC code generated by the polynomial generator of degree 9, $G9(X)=X^9+X^4+1$, of the extended payload and storing the resulting 9-bit stream FCS in 9-bit storage means by a) sequentially receiving a sequence of data bytes in the 9-bit storage means (220), b) pushing each byte of said data byte sequence into said 9-bit storage means until said 9-bit storage means is full, c) multiplying (210) the contents of said 9-bit storage means by the bit stream corresponding to $\alpha^n$, an element of Galois Field generated by the generator polynomial G9 (X), $\alpha$ being an irreducible polynomial, root of said Galois Field, d) updating the content of said 9-bit storage means by loading the result of said multiplying step into said 9-bit storage means, and e) repeating steps c, d, e until all data bytes have been pushed into said 9-bit storage means;

testing (540) if all the bits of the resulting 9-bit stream are equal to zero, the result of packet integrity checking being negative (560) if all said bits are not equal to zero;

if all the bits of the resulting 9-bit stream are equal to zero, testing the 1-bit parity of said extended payload, the result of packet integrity checking being negative (560) if said 1-bit parity is not equal to zero, the result of packet integrity checking being positive (570) if said 1-bit parity is equal to zero.

3. The method of claim 1 where the packet payload bit stream is a sequence of n-bits data bytes and the step for calculating the CRC code generated by the polynomial generator of degree 9, $G9(X)=X^9+X^4+1$, of the packet payload consists in successive n-bit byte cycle processing, said method comprising the steps of:

a—sequentially receiving said sequence of data bytes in the 9-bit storage means (220);

b—pushing each byte of said data byte sequence into said 9-bit storage means, until said 9-bit storage means is full;

c—multiplying (210) the contents of said 9-bit storage means by the bit stream corresponding to $\alpha^n$, an element of Galois Field generated by the generator polynomial G9(X), $\alpha$ being an irreducible polynomial, root of said Galois Field, d—updating the content of said 9-bit storage means by loading the result of said multiplying step into said 9-bit storage means, e—repeating steps c, d, e until all data bytes have been pushed into said 9-bit storage means.

4. An apparatus to calculate the FCS (Frame Check Sequence) based on CRC (Cyclic Redundancy Check) code generated by the polynomial generator of degree 10, $G10(X)=X^{10}+X^9+X^5+X^4+X+1$, of a packet payload in a packet network to be sent onto a network line, said apparatus comprising the following means:

means (200, 210, 220) for calculating the CRC code generated by the polynomial generator of degree 9, $G9(X)=X^9+X^4+1$, of the fixed length packet payload and storing the resulting 9 bit stream FCS in 9-bits storage means;

means for calculating the parity of said payload and storing it in a 1-bit storage means (247);

means for setting 10-bit storage means to zero;

means (240) for adding to each of the 9-bit stream read from the 9-bit stream storage means the 1 bit storage means and to the resuting 9-bit stream, the 10-bit stream representing the to the polynomial generator of degree 9, $G9(X)=X^9+X^4+1$;

means (250) for storing the 10-bit stream resulting of the addition of the previous step in the 10-bit storage means, this stored 10-bit stream representing the payload FCS that was to be calculated.

5. An apparatus for checking in a network node, the integrity of a packet in a packet network, having a payload field comprising an extended field with the 10-bit stream FCS (Frame Check Sequence) calculated on the payload before extension, said 10-bits FCS being based on CRC (Cyclic Redundancy Check) code generated by the polynomial generator of degree 10, $G10(X)=X^{10}+X^9+X^5+X^4+X+1$, said appparatus comprising the following means:

means (200, 210, 220) for calculating the CRC code generated by the polynomial generator of degree 9, $G9(X)=X^9+X^4+1$, of the fixed length extended payload and means for storing the resulting 9-bit stream FCS in 9-bit storage means;

means for testing the resulting 9-bit stream, if all the bits are not equal to zero, the result of packet integrity checking is negative;

means for calculating, if all the bits of the resulting 9-bit stream are equal to zero, the 1-bit parity of said extended payload, the result of packet integrity checking being negative if the 1-bit parity is not zero and positive if the 1-bit parity is zero.

6. The apparatus of claim 4 or 5 where the packet payload bit stream is a sequence of n-bits data bytes, wherein the data bytes are sequentially received and a computation operation on said data bytes is made in successive cycles in order to generate said FCS, said apparatus comprising:

storage means having a number of bit positions equal to the number of the FCS bits, into which each byte of said data bytes is pushed until said storage means is full;

Galois Field multiplier means activated at each cycle to multiply the contents of said storage means by an element of the Galois Field;

gating means to load said storage means with the result of said Galois Field multiplication;

means for pushing a new byte of said data bytes into said storage means at each cycle, whereby said storage means contains at each cycle the current FCS.

* * * * *